United States Patent [19]

Ogasawara et al.

[11] Patent Number: 5,156,731
[45] Date of Patent: Oct. 20, 1992

[54] POLYIMIDE SUBSTRATE AND METHOD OF MANUFACTURING A PRINTED WIRING BOARD USING THE SUBSTRATE

[75] Inventors: Shuichi Ogasawara; Daizo Tomioka, both of Ichikawa, Japan

[73] Assignee: Sumitomo Metal Mining Co. Ltd., Tokyo, Japan

[21] Appl. No.: 863,513

[22] Filed: Mar. 31, 1992

Related U.S. Application Data

[63] Continuation of Ser. No. 448,635, Dec. 11, 1989, abandoned.

[30] Foreign Application Priority Data

Dec. 13, 1988 [JP] Japan .................................. 63-312830
Feb. 21, 1989 [JP] Japan .................................. 1-39325
Apr. 17, 1989 [JP] Japan .................................. 1-96995

[51] Int. Cl.$^5$ ............................................... C25D 5/54
[52] U.S. Cl. .................................... 205/126; 205/224
[58] Field of Search ................ 205/126, 224; 427/306

[56] References Cited

U.S. PATENT DOCUMENTS 4,517,254  5/1985  Grapentin .......................... 204/30
4,775,449  10/1988  Dumas ................................. 204/30
4,842,946  6/1989  Foust ................................... 204/20

Primary Examiner—T. M. Tufariello
Attorney, Agent, or Firm—Watson, Cole, Grindle & Watson

[57] ABSTRACT

A method of preparing a copper-polyimide substrate comprising applying an electroless copper plating to the surface of a polyimide resin and, if required, further applying an electrolytic copper plating successively thereto, wherein heat treatment is applied to the substrate after the electroless copper-plating treatment within a temperature range from 120° to 420° C. The metal plating layer has an excellent adhesion capable of withstanding thermal shocks. The substrate can be used for producing electronic parts having high reliability with stable operationability.

10 Claims, No Drawings

POLYIMIDE SUBSTRATE AND METHOD OF MANUFACTURING A PRINTED WIRING BOARD USING THE SUBSTRATE

CROSS-REFERENCE TO RELATED APPLICATION

This application is a continuation of application Ser. No. 448,635, filed Dec. 11, 1989, now abandoned.

BACKGROUND OF THE INVENTION

1. Field of the Invention

The present invention concerns a copper-polyimide substrate, in which a copper plating layer capable of withstanding high temperature treatment at 200° C. or higher and sufficiently resistive to thermal shocks caused by soldering, etc., is formed partially or entirely to the surface of a polyimide resin as well as a method of manufacturing a printed wiring board using the substrate.

2. Description of the Prior Art

Since polyimide resins have excellent heat resistance and are comparable with other plastic materials in view of mechanical, electrical and chemical properties, they are often used as insulation materials such as electric appliances. Printed wiring boards (PWB), flexible printed circuits (FPC), tape automated bonding (TAB), etc. are manufactured by applying photoetching to a copper layer formed on the polyimide resin.

Copper-polyimide substrates as the material used for such PBW, FPC and TAB have generally been prepared by a lamination method of appending a polyimide resin and a copper foil by means of adhesives. However, in a substrate prepared by the lamination method, impurities such as chlorine ions or sulfate ions are absorbed to an adhesive layer present at the boundary between the copper layer and the polyimide resin of the substrate upon etching treatment for the copper layer or peeling treatment for the photoresist, which may lead to a trouble such as insulation failure in a case where distance between circuits formed on the substrate is particularly narrow. In order to overcome such a drawback, there has been studied a method of forming a metal layer directly to the surface of the polyimide resin not by way of the adhesive, etc.

As the method described above there has been known a method of depositing a metal layer directly to the surface of the polyimide resin by means of sputtering, ion plating, vapor deposition, etc., a method of coating a solution of a polyamide acid as a precursor for a polyamide on the a layer and, thereafter, imidizing the polyamide to obtain a substrate or a method of forming a metal plating layer to the surface of a polyimide resin by means of electroless plating.

Among the methods described above, in the method of depositing the metal layer directly to the surface of the polyimide resin, for example, by means of sputtering, ion plating and vapor deposition, since residual stresses are formed in the copper layer deposited on the surface of the polyimide resin, stresses are concentrated to the boundary between the polyimide resin and the copper film layer when of a heat treatment is further applied to the substrate to remarkably reduce the adhesion of the copper film, which may be some time lead to the peeling of the film.

Further, a polyimide resin deposited with a copper film by means of sputtering, ion plating or vapor deposition has often been heated for improving the adhesion of the metal film layer, but a problem is also brought about that copper diffuses into the polyimide resin and deposited as copper oxide particles, thereby remarkably deteriorating the electric property and mechanical property of the substrate.

In order to overcome these problems, it has also been proposed a method of forming an intermediate chromium or nickel layer between a polyimide resin and a copper film to obtain a three-layered structure, applying heat treatment to the structure, thereby absorbing the stresses concentrated to the boundary in this intermediate layer to prevent reduction of adhesion and peeling of the copper film, as well as to prevent the deposition of copper oxide caused by the diffusion of copper in the polyimide resin. However, in a case of forming circuits by using the substrate obtained by the method and applying patterning, for example, by means of subtractive method, since the metal layer formed on the polyimide resin contains metals such as chromium or nickel in addition to copper, other metals such as chromium or nickel can not be removed completely but remain as they are when treated with a standard etching solution prepared for the removal of copper, failing to obtain satisfactory circuit formation.

In addition, if chromium or nickel is contained in the metal layer, electrical conductivity is poor as compared with the case that the layer is formed with pure copper and, if such a substrate is used as electronic material part, reliability is remarkably reduced. Further, even with such a method, when TAB is manufactured based on the resultant substrate, the of the metal layer is utmost 4 lb/in, which is less than 6 lb/in required so far for TAB or printed wiring board.

Further, among the substrate forming methods described above, a method of coating a polyamide acid solution as a precursor of the polyimide on a metal film, and then polyimidizing the same thereby obtaining a copper-polyimide substrate without using the intermediate adhesive layer has been disclosed in U.S. Pat. Nos. 3,682,960, 4,148,969 and 4,496,794, etc. However, in the copper-polyimide substrate obtained by the method, the resin portion of the substrate shrinks remarkably since dehydrating condensation also occurs upon polyimidization of the polyamide acid, which makes it extremely difficult to provide smoothness for the substrate and the substrate lacks in dimensional stability.

Furthermore, the polyimide resin portion in the substrate obtained by the method is remarkably lower in the mechanical strength as compared with the polyimide resin usually supplied in a film-like shape. The reason dues to that the chemical structure of the polyimide resin obtained by the above-mentioned method is different from that of the polyimide resin supplied in the film-like shape and, although the bondability with the metal layer can be improved, mechanical property such as elongation is poor. Furthermore, in a case where the polyamide acid is coated on the copper film, since a copper portion reacts with amide groups and diffuses into the resin portion, electric property of the substrate is deteriorated and reliability as electronic material is neither sufficient.

Further, the third method for obtaining the copper-polyimide substrate is a method of applying metal coating to the surface of the polyimide resin by means of electroless plating. In this method, etching treatment is usually applied to the surface of the imide resin, thereby providing hydrophilic property, adsorbing thereon palladium, etc. as a catalyst and then applying electroless plating.

U.S. Pat. No. 3,767,538 describes a method of producing a substrate applied with a metal coating by means of electroless plating. The feature of the process resides in applying etching to the surface of the polyimide resin using a solution of sulfuric acid and hydrochloric acid, or mechanically impinging fine particles such as sands to the surface, further, applying etching if required by means of sodium hydroxide, heating them to remove water content, and then immersing them into a colloidal palladium bath, thereby applying a catalyst activation treatment. Subsequently, a silver plating layer having steam permeability is continuously formed to the surface of the polyimide resin by means of electroless plating, heating the substrate to 150° C. for removing water content and, thereafter, applying electrolytic copper plating on the silver film thereby obtaining a copper-polyimide substrate.

However, nothing is reported for the value of the adhesion of the metal layer on the substrate manufactured by the method and, further, since the silver film is directly formed to the surface of the polyimide resin in this method, there is a possibility that insulation failure may be caused between circuits due to silver migration under a high temperature and a high humidity, thus lacking in the reliability in a case of using the TAB tape, etc., manufactured by using the resultant substrate as electronic parts.

U.S. Pat. No. 3,573,973 suggests another method of forming a metal layer by applying electroless plating to the surface of a polyimide resin. The method resides in applying a catalyst to the surface of a polyimide resin, then forming a plated resist layer, applying nickel-phosphor alloy electroless plating, heating the substrate at a temperature of 190° C. for strengthening the bonding between the plated layer and the polyimide resin and, subsequently, electrolytically plating copper or applying or soldering copper thereon, to obtain a substrate. However, the maximum adhesion of the metal layer is reported to be 5.0 lb/in according to the non-standard test. While the literature suggests nothing about the stability of the adhesion against thermal shocks such as soldering, there is a possibility of causing problems regarding this.

Japanese Patent Laid-Open Sho 63-259083 discloses a method of applying electroless nickel or cobalt plating partially or entirely to the surface of a polyimide resin and applying electrolytic copper plating thereon, thus forming a metal film having a great bondability capable of withstanding thermal shocks such as soldering on a polyimide resin.

The feature of the methods resides in applying etching to the surface of the polyimide resin with an aqueous solution containing an amine of $H_2N(CH_2)_nNH_2$ (n represents an integer between 2 and 6), an alkali metal hydroxide and an alcohol of a structure soluble to water, providing a catalyst, applying electroless nickel and cobalt plating and, finally, applying electrolytic copper plating.

The adhesion of the metal layer in the disclosed example of the substrate obtained by the method is 10.0 lb/in according to IPC-TM-650 Method 2.4.9. As received Method A and 5.0 lb/in according to IPC-TM-650 Method 2.4.9 After solder Float Method C, by which the adhesion satisfactory to some extent can be obtained. However, although it has been reported that nickel and cobalt in the substrate obtained by the above-mentioned method could be removed finally by means of an iron chloride etching solution, if the substrate is utilized for a TAB tape, with narrow width and interval of lead, the copper lead can not maintain the shape till the complete removal of the nickel and cobalt layer due to the difference of the solubility of nickel and cobalt relative to iron chloride and, accordingly, reliability is poor when they are assembled as an electronic part. Further, in a case of forming a copper layer by electroless copper plating directly to the surface of the polyimide resin by the above-mentioned method, it has been shown that the copper layer is peeled off in IPC-TM-650 Method 2.4.9 After solder Float Method C. Thus, at present, it has not yet been actually established a technique capable of forming directly, on a substrate, a copper layer having adhesion capable of withstanding thermal shock such as soldering partially or entirely to the surface of the polyimide resin.

Further, in a case of using a substrate obtained by applying an electroless plating to the polyimide resin as described above, applying patterning to form a copper layer of a desired width and then applying plating to the copper layer by using a solution containing a free cyan compound thereby preparing a wiring board, there has also been found a problem that the copper layer is peeled off from the surface of the polyimide resin.

OBJECT OF THE INVENTION

It is, accordingly, an object of the present invention to provide a method of forming a copper-polyimide substrate prepared by forming partially or entirely to the surface of a resin a copper film having such a high adhesion as sufficiently withstanding thermal shocks such as caused by soldering by means of electroless plating, being free from metal layer peeling when used for electronic parts such as TAB and providing highly reliable electrical, mechanical and thermal property, as well as a method of manufacturing printed wiring boards using such a substrate.

The present inventors have made various studies for the reason why it is impossible to obtain a copper film having such a high adhesion as capable of withstanding thermal shocks such as caused by soldering in the copper-polyimide substrate obtained by the electroless plating method and, as a result, have accomplished the present invention based on the finding that a denature layer of poor heat resistance is often formed on the surface of a polyimide resin by applying pre-treatment of electroless plating in the method conducted so far and, upon applying electroless plating and applying thermal shocks such as by soldering to the substrate in this state, the plating layer tends to easily peel off from the interface between the denatured layer portion or the polyimide resin and the denatured layer, further, that since the denatured layer is dissolved by a free cyan or cyan compound used in the case of manufacturing a printed wiring bond, etc. by using the substrate, peeling of the metal layer from the surface of the substrate is also promoted therewith, as well as that the denatured layer can be converted into thermally resistant structure by applying heat treatment within an appropriate temperature range to the substrate containing the denatured layer.

That is, the method according to the present invention of preparing a substrate by applying electroless copper plating to a polyimide resin, for overcoming the foregoing problems, comprises applying heat treatment to a substrate in a non-oxygen atmosphere at a temperature range from 120° to 420° C. or in an atmospheric air or at a temperature from 250° to 420° C., after applying electroless plating, after applying electrolytic copper plating applied as required continuously, or in the step of manufacturing a printed wiring board by using such a substrate.

Generally, upon manufacturing a copper-polyimide substrate by electroless plating, it is necessary to render the surface of the resin hydrophilic by applying an etching treatment to the surface of the polyimide resin for providing a catalyst in order to promote the plating prior to applying the plating treatment. An etching solution generally used for providing the hydrophilic property to the polyimide resin, there can be mentioned an alkaline solution such as an aqueous solution of amine compound, e.g., hydrazine or ethylene diamine or an aqueous solution of alkali metal hydroxide and containing alcohols such as ethanol.

In the case of treating the surface of the polyimide resin with such an etching solution, carbonyl groups constituting the imide ring of the polyimide resin undergo hydrolysis to form a denatured layer comprising a polyamide containing carboxyl groups on the surface of the resin. The denatured layer thus formed to the surface of the polyimide resin has a hydrophilic property and an effect of providing the surface of the resin with hydrophilic property. However, since the denatured layer is remarkably poor in the heat resistance as compared with the polyimide resin, when thermal shock such as caused by soldering is applied to the substrate obtained after the plating treatment, peeling occurs readily from the denatured layer or from the boundary between the polyimide resin and the denatured or layer. In the method according to the present invention, a heat treatment at 120°–420° C. is applied to the substrate after the electroless plating and application of the heat treatment within an appropriate temperature range to the substrate causes dehydrating condensation between amide groups and carboxyl groups contained in the denatured layer, by which the denatured layer is imidized again and converted into a thermally resistant structure.

Accordingly, if thermal shocks such as by soldering is applied to a substrate applied with such heat treatment after electroless plating, no peeling occurs to the metal layer and the metal layer has such adhesion as capable of sufficiently satisfying the values required for electronic components such as TAB, that is, the adhesion in average is 7.0 lb/in in accordance with IPC-TM-650 Method 2.4.9 AS received Method A, while 6.0 lb/in in accordance with IPC-TM-650 Method 2.4.9 After Solder Float Method C.

As has been described above, the heat treatment applied after the electroless plating in the method according to the present invention is conducted with an aim of improving the chemical structure of the denatured layer formed by the plating pre-treatment, is essentially different from the heating applied at 70°–150° C. with an aim of removing water content generally employed in the electroless plating. Temperature required for imidizing the denatured layer again by the heat treatment in accordance with the present invention is different depending on the method of heat treatment. For instance, a temperature higher than 120° C., preferably, in excess of 150° C. is required in the case of applying heat treatment by using a vacuum heating furnace. Further, a temperature of higher than 250° C. is required in the case of applying heat treatment in an atmospheric air by or inert gas atmosphere using an ordinary heating furnace.

If the temperature for the heat treatment is lower than the above-mentioned temperature, the imidizing reaction for the the denatured layer less occurs. On the other hand, if temperature exceeds 420° C. in any of the heat treatments, excellent properties inherent to the polyimide per se are deteriorated due to the heat treatment since the glass transition point of the polyimide resin is 420° C.

The time for the heat treatment carried out in the present invention varies depending on various conditions such as the method of plating pre-treatment or temperature of heat treatment for the polyimide resin and can not be determined generally. Accordingly, it is desirable to previously determine the conditions for the heat treatment by means of preliminary experiment, etc. upon actual practice.

The polyimide resin used in the present invention may be any of resins imidized by thermal or chemical dihydro condensation of amide groups and carboxyl groups of the polyamide acid and they can include, for example, a Kapton (trade name of product manufactured by Dupont-Toray Co., Ltd.) having the following chemical formula:

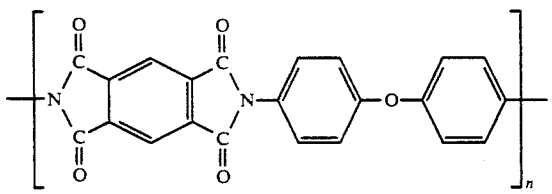

or Upilex (trade name of product manufactured by Ube Industries, Ltd.) having the following chemical formula:

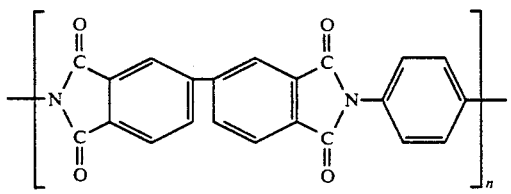

The step of applying the heat treatment in the present invention is different depending on the desired plating positions to the polyimide resin. That is, in a case of applying plating partially to the surface of the polyimide resin, the heat treatment in accordance with the present invention may be applied either after the electroless plating or after the electrolytic plating applied subsequently. Since steams generated upon heat treatment permeate to escape from the surface of the polyimide resin, neither the swelling at the plating interface nor the peeling of the plating layer occurs.

In a case of applying plating to the entire surface of the polyimide resin, it is necessary to apply the heat treatment after the electroless plating or at a stage when an electrolytically plated thin layer of less than 5 um has been formed. If heat treatment is applied after the copper plating layer has been formed to more than 5 um to the entire surface of the polyimide resin, since steams evolved upon heat treatment can not completely permeate through the copper films, it may cause a worry that swelling may occur along the boundary of the plating layer or the plating layer may be peeled off.

Further, the heat treatment conducted in the present invention can be applied, not in the production step of the electroless-plated substrate, but in the production step for various printed wiring boards manufactured by utilizing the resultant substrate. That is, such a printed wiring board is usually obtained by patterning a copper-polyimide substrate prepared by electroless plating such that a metal layer of a desired width is formed by the patterning treatment and then applying plating treatment to the metal layer by using a solution containing a free cyan or cyan compound. However, in the thus obtained wiring board, the metal layer often peels off from the surface of the substrate to deteriorate the reliability of the products. The present inventors have studied on this phenomenon and, as a result, confirmed this is caused when the denatured layer of the polyimide resin formed by the electroless plating pre-treatment by the patterning treatment is exposed to the surface of the substrate, and dissolved by a solution containing a free cyan or cyan compound, which makes the deposition of the metal layer instable at the surface of the substrate to cause peeling.

Accordingly, when applying a heat treatment within a temperature range from 120° to 420° C. to a substrate before applying the plating treatment to the substrate by using the cyan solution, thereby imidizing the denatured layer so as to be less soluble to the solution containing the free cyan or cyan compound, it is possible to prevent the peeling of the metal layer of the substrate.

Further, in the present invention, there is no particular restriction for the temperature of the heat treatment. That is, similar effect can also be obtained in any of atmospheric, inert gas or vacuum atmosphere. However, in view of preventing oxidation of the copper layer, it can be considered that heat treatment under a non-oxygen atmosphere is more preferred.

EXAMPLE

The present invention is to be explained referring to examples.

EXAMPLE 1

The entire surface of a polyimide resin film specimen, sized 30 cm×30 cm made of Kapton 200H manufactured by Dupont-Toray Co., Ltd. was immersed into an aqueous solution containing 30% by weight of hydrazine hydrate at 25° C. for 30 sec to apply an etching treatment washed with water and then applied with an immersion treatment using an aqueous 5 wt % hydrochloric acid solution at 25° C. for 15 sec. Subsequently, water washing was further applied, a catalyst providing treatment is applied by using OPC-80 Catalyst M manufactured by Okuno Chemical Industries, Co., Ltd. at 25° C. for 5 min, sufficiently washed with water and then applying accelerating treatment by using OPC-555 accelerator manufactured by Okuno Chemical Industries, Co., Ltd. at 25° C. for 7 min. Then, after applying a further water washing, the surface of the film was dried at 20° C. for 2 min. After conducting the foregoing pre-treatment, electroless copper plating was applied under the conditions shown below.

| Bath Composition | |
| --- | --- |
| $CuSO_4 \cdot 5H_2O$ | 10 g/l |
| $EDTA \cdot 2Na$ | 30 g/l |

| -continued | |
| --- | --- |
| 37% HCHO | 5 ml/l |
| dipyridyl | 20 mg/l |
| PEG #1000 | 0.5 g/l |
| Plating Condition | |
| Temperature | 65° C. |
| Stirring | air |
| Time | 3 min |

The thickness of the resultant electroless plated copper was 0.2 um.

Then, the substrate was stood still in a vacuum heating furnace in which the temperature was elevated at a rate of 10° C./min under a vacuum degree of $10^{-4}$ Torr, and after applying heat treatment at 350° C. for 6 hours, it was cooled to a room temperature.

Further, the substrate was applied with electrolytic copper plating under the conditions shown below.

| Bath Composition | |
| --- | --- |
| $CuSO_4 \cdot 5H_2O$ | 120 g/l |
| $H_2SO_4$ | 150 g/l |
| Electrolysis Condition | |
| Temperature | 25° C. |
| Cathode current density | 3A/dm² |
| Stirring | air and cathode locker |
| Time | 30 min |

The thickness of the resultant copper film on the substrate was 35 um. The adhesion was 6.0 lb/in in average according to IPC-TM-650 Method 2.4.9 As received Method A and 6.0 lb/in in average according to IPC-TM-650 Method 2.4.9 After solder float Method C.

The difference in the adhesion depending on the positions of the substrate was slight and it was confirmed that substantially homogenous plating film was formed.

These facts demonstrate that the substrate has sufficient reliability in a case of using as electronic parts such as TAB.

EXAMPLE 2

A copper-polyimide substrate was prepared by the same procedures as those in Example 1 except for using a polyimide resin film made of Kapton 100 H manufactured by Dupont-Toray Co., Ltd.

The adhesion strength of the resultant copper film of the substrate was 6.9 lb/in in average according to IPC-TM-650 Method 2.4.9 As received Method A and 6.0 lb/in in average value according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 3

A copper-polyimide substrate was prepared by the same procedures as those in Example 1 except for using a polyimide resin film made of Kapton 500 H manufactured by Dupont-Toray Co., Ltd.

The adhesion of the resultant copper film of the substrate was 7.8 lb/in tin as average according to IPC-TM-650 Method 2.4.9 As received Method A and 6.4 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 4

A copper-polyimide substrate was prepared by the same procedures as those in Example 1 except for using a polyimide resin film is made of Kapton 200 V manufactured by Dupont-Toray Co., Ltd.

The adhesion strength of the resultant copper film of the substrate was 7.2 lb/in in average according to IPC-TM-650 Method 2.4.9 As received Method A and 6.2 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 5

A copper-polyimide substrate was prepared by the same procedures as those in Example 1 except for using a polyimide resin film made of Upilex 50 ss manufactured by Ube Industries, Ltd.

The adhesion of the resultant copper film of the substrate was 7.6 lb/in in average according to IPC-TM-650 Method 2.4.9 As received Method A and 6.3 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 6

A copper-polyimide substrate was prepared by using the same polyimide resin film as in Example 1, sealing the film on one side and formation of the copper film and heat treatment were applied in the same procedures as those in Example 1 only for the other side of the film.

The adhesion strength of the resultant copper film of the substrate was 9.4 lb/in in average according to IPC-TM-650 Method 2.4.9 As received Method A and 7.7 lb/in in average according to IPC-TM-650 Method 2.4.9 After solder float Method C.

Further, the difference in the adhesion depending on the positions of the copper film formed on one side of the substrate was scarcely recognized and it was homogenous.

These facts demonstrate that the substrate formed with the copper film on one side has sufficient reliability in a case of using as electronic parts such as TAB.

EXAMPLE 7

A copper-polyimide substrate was prepared in the same procedures as those in Example 1 by using the same type of polyimide resin film as in Example 1, except for using an aqueous 50 wt % solution of hydrazine hydrate for the etching of the surface of the polyimide resin film.

The adhesion of the resultant copper film of the substrate was 6.9 lb/in in average according to IPC-TM-650 Method 2.4.9 As received Method A and 6.1 lb/in in average value according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 8

A copper-polyimide substrate was prepared with the same materials and procedures as those in Example 1 except for applying electroless plating to the surface of the resin film, applying electrolytic copper plating to the surface to a thickness of 5 um and then applying heat treatment thereto.

The adhesion of the resultant copper film of the substrate was 6.9 lb/in in average according to IPC-TM-650 Method 2.4.9 As received Method A and 6.0 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 9

A copper-polyimide substrate formed with a copper film on one side was prepared with the same materials and procedures as those in Example 6 except for not applying heat treatment after the electroless plating and forming an electrolytic copper plating film of 35 um thickness.

The adhesion of the resultant copper film of the substrate was 9.6 lb/in in average according to IPC-TM-650 Method 2.4.9 As received Method A and 7.9 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 10

A copper-polyimide substrate was prepared with the same materials and procedures as those in Example 1 except for changing the temperature elevation rate in the vacuum heating furnace to 30° C./min upon applying the heat treatment and applying heating at 420° C. for one hour.

The adhesion of the resultant copper film on the substrate was 7.6 lb/in in average according to IPC-TM-650 Method 2.4.9 As received Method A and 6.8 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 11

A copper-polyimide substrate was prepared by the same materials and procedures as those in Example 1 except for changing the temperature elevation rate in the vacuum heating furnace to 20° C./min upon applying the heat treatment and applying heating at 150° C. for 24 hours.

The adhesion of the resultant copper film of the substrate was 7.4 lb/in in average according to IPC-TM-650 Method 2.4.9 As received Method A and 6.5 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 12

A copper-polyimide substrate was prepared with the same materials and procedures as those in Example 1 except for applying heat treatment at 250° C. for 12 hours.

The adhesion of the resultant copper film on the substrate was 7.6 lb/in in average according to IPC-TM-650 Method 2.4.9 As received Method A and 6.8 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 13

A copper-polyimide substrate was prepared with the same materials and procedures as those in Example 1 except for applying heat treatment in a heating furnace maintained in a nitrogen atmosphere at 350° C.

The adhesion of the resultant copper film on the substrate was 6.6 lb/in in average value according to IPC-TM-650 Method 2.4.9 As received Method A and 6.0 lb/in in average according to IPC-TM-650 Method 2.4.9 After solder float Method C.

Further, the difference in the adhesion depending on the positions of the substrate was scarcely recognized and it was homogenous.

These facts demonstrate that the substrate has sufficient reliability in a case of using as electronic parts such as TAB.

EXAMPLE 14

A copper-polyimide substrate formed with a copper film on one side was prepared with the same materials and procedures as those in Example 6 except for applying heat treatment in a usual heating furnace maintained in an atmospheric air at a temperature of 350° C.

The adhesion of the resultant copper film of the substrate was 8.8 lb/in in average according to IPC-TM-650 Method 2.4.9 As received Method A and 6.9 lb/in in average according to IPC-TM-650 Method 2.4.9 After solder float Method C. Further, the difference in the adhesion depending on the positions of the substrate was scarcely recognized and it was homogenous.

These facts demonstrate that the substrate has sufficient reliability in a case of using as electronic parts such as TAB.

EXAMPLE 15

After sealing one side of the surface of the polyimide resin and applying electroless copper plating on the other side in Example 1, heat treatment was applied and a TAB tape was manufactured by the following step. That is, a photoresist of acrylic resin was uniformly coated to 40 um thickness on a copper film of the thus obtained substrate and then baked at 70° C. for 15 min. Then, masking was applied over the substrate such that leads of 70 um width and 70 um pitch were formed in an outer lead portion, and UV-rays were irradiated at 1000 mJ/cm$^2$ on the photoresist layer, which was then resist layer was developed.

Subsequently, electrolytic copper plating was applied on the electroless copper plated film thus exposed under the following conditions.

| Bath Composition | |
|---|---|
| CuSO$_4$.5H$_2$O | 120 g/l |
| H$_2$SO$_4$ | 150 g/l |
| Electrolysis Condition | |
| Temperature | 25° C. |
| Cathode current density | 3A/dm$^2$ |
| Stirring | Air and cathode locker |
| Time | 30 min |

Then, the resist layer was peeled and removed at 60° C. for one min by using an aqueous 4 wt % solution of sodium hydroxide and the exposed electroless copper plated film was applied with peeling treatment by using the electrolytically plated copper film as a mask and using an aqueous 20 wt % solution of cupric chloride at 25° C. for one min.

Then, after applying a rubber type photoresist uniformly to a 5 um thickness over the entire surface of the substrate, the photoresist layer was exposed and developed by aligning a mask for opening bire holes and device holes with the surface constituted with the polyimide resin and the rubber type photoresist with the copper lead being situated in the device hole.

Then, after immersing the substrate in a solution of hydrazine hydrate at 40° C. for 15 min and dissolving the polyimide resin, rubber photoresist was peeled off.

By way of the steps described above, a TAB tape having copper leads of 35 um thickness, 70 um width and 70 um interval could be prepared.

In the case of using the TAB tape as electronic parts, they were excellent in electrical, mechanical and heat resistant properties, as well as stable production could be carried out with no problems such as peeling of copper layer upon production.

EXAMPLE 16

In Example 15, the heat treatment was not applied in the step of manufacturing the copper-polyimide substrate but applied to the substrate formed with a circuit for the copper-lead portion in the next step by keeping heating for one hour in a heating furnace of a nitrogen gas atmosphere maintained at 300° C., and then gold plating was applied on the copper layer of the substrate by using a gold plating solution N-44 containing potassium cyanoaurate at a concentration of 17 g/l manufactured by N.E. Chemcat Co., Ltd. under the following conditions:

| Plating Condition | |
|---|---|
| Temperature | 70° C. |
| Cathode current density | 1A/dm$^2$ |
| Stirring | cathode locker |
| Time | 9 min |

Peeling of the plated layer on the substrate of the obtained TAB tape did not occur. Since the TAB tape is excellent in electrical and mechanical properties, as well as in thermal properties, it has sufficient reliability as electronic material.

Although the explanation has been made for the production method of TAB tapes in Examples 1-5 and this example, it has been confirmed that similar excellent effect can be obtained also for the application to the manufacture of various other electronic parts such as circuit wiring boards, for example, printed wiring boards, flexible printed circuits, etc.

COMPARATIVE EXAMPLE 1

A copper-polyimide substrate was prepared in the same procedures as those in Example 1 except for not applying heat treatment after electroless plating.

The adhesion of the copper film of the resultant substrate was 2.0 lb/in in average in accordance with IPC-TM-650 Method 2.4.9 As received Method A and the adhesion was impossible to measure in IPC-TM-650 Method 2.4.9 After solder float Method C since the copper film was completely peeled from the substrate.

Accordingly, it has been found that the substrate could not be used as electronic parts such as TAB.

COMPARATIVE EXAMPLE 2

A copper-polyimide substrate was prepared in the same procedures as those in Example 1 except for applying heat treatment after electroless plating in a nitrogen gas stream at 200° C. for 24 hours.

The adhesion of the copper film of the resultant substrate was 1.0 lb/in in average in accordance with IPC-TM-650 Method 2.4.9 As received Method A, the adhesion value of the copper layer in the substrate varied remarkably depending on the positions. Peeling of the copper layer from the substrate occurred in IPC-TM-650 Method 2.4.9 After solder float Method C, and it has been found that the substrate could not be used as electronic parts such as TAB.

COMPARATIVE EXAMPLE 3

A copper-polyimide substrate was prepared in the same procedures as those in Example 1 except for applying heat treatment after electroless plating in an atmospheric air at 430° C. for 30 min.

In the resultant substrate, a portion of the polyimide resin was carbonized. Accordingly, it has been found that the substrate applied with the heat treatment at such a high temperature could not be used for electronic parts such as TAB.

According to the present invention of preparing a non-adhesion type copper-polyimide substrate, since a denatured layer having thermally stable property formed at the surface of a polyimide resin by the electroless plating pre-treatment can be modified into a thermally stable structure by applying an electroless copper plating directly partially or entirely to the surface of the polyimide resin, it is possible to provide the thus formed metal plating layer with such a sufficient adhesion as withstanding thermal shock such as caused by soldering, etc.

Further, in the case of manufacturing an electronic part such as a TAB tape by using the substrate, since products having sufficiently high reliability in electrical, mechanical and thermal point of view can be obtained and since peeling of metal layer, etc. does not upon production, it can provide an excellent effect of improving the performance of products and capable of attaining stable operation.

What is claimed is:

1. A method of preparing a copper-polyimide substrate comprising the steps of applying an electroless copper plating to the surface of a polyimide resin to form a composite and heat treating said composite within a temperature range from 120° to 420° C. in a vacuum atmosphere.

2. A method as defined in claim 1, wherein an electrolytic copper plating is further applied after the electroless copper plating.

3. A method as defined in claim 2, wherein the electrolytic copper plating layer is applied with thickness of less than 5 um.

4. A method as defined in claim 1, wherein the heat treatment for the substrate is applied under a nonoxygen atmosphere.

5. A method of preparing a printed wiring board comprising a first step of applying electroless copper plating to the surfaces of a polyimide resin and obtaining a copper-polyimide substrate and a second step of applying a circuit forming treatment by using the resultant copper-polyimide substrate, and including a step of heat treating said substrate within a temperature range from 120° to 420° C. in a vacuum atmosphere before the plating of a conductive metal using at least one of a free cyan and a cyan compound applied upon circuit forming treatment in the second step.

6. A method as defined in claim 5, wherein an electrolytic copper plating is further applied after the electroless copper plating.

7. A method as defined in claim 6, wherein the electrolytic copper plating layer is applied with thickness of less than 5 um.

8. A method as defined in claim 5, wherein the heat treatment for the substrate is applied under a nonoxygen atmosphere.

9. A method of preparing a copper-polyimide substrate comprising the steps of applying an electroless copper plating to the surface of a polyimide resin to form a composite and heat treating said composite within a temperature range from 250° to 420° C. in atmospheric air or an inert gas atmosphere.

10. A method of preparing a printed wiring board comprising a first step of applying electroless copper plating to the surfaces of a polyimide resin and obtaining a copper-polyimide substrate and a second step of applying a circuit forming treatment by using the resultant copper-polyimide substrate, and including a step of heat treating said substrate within a temperature range from 250° to 420° C. in atmospheric air or an inert gas atmosphere before the plating of a conductive metal using at least one of a free cyan and a cyan compound applied upon circuit forming treatment in the second step.

* * * * *